SURFACE FIELD-EFFECT DEVICE HAVING A TUNABLE HIGH-PASS FILTER PROPERTY

Filed July 15, 1965

INVENTOR.

V. GOPALA KRISHNA REDDI,

BY Roger S. Borovoy
Stuart Lubitz

ATTORNEYS.

3,296,462
Patented Jan. 3, 1967

3,296,462

SURFACE FIELD-EFFECT DEVICE HAVING A TUNABLE HIGH-PASS FILTER PROPERTY

Venumbaka Gopala Krishna Reddi, San Mateo, Calif., assignor to Fairchild Camera and Instrument Corporation, Long Island, N.Y., a corporation of Delaware Filed July 15, 1965, Ser. No. 472,137
4 Claims. (Cl. 307—88.5)

This invention relates to a metal oxide semiconductor device having a tunable filter type response with insertion gain in the pass band.

The two most common prior art field-effect devices are the MOST (metal oxide silicon transistor) and the FET (field-effect transistor). The MOST is discussed in detail in the publication "Characteristics of the Metal Oxide Semiconductor Transistors" by C. T. Sah, IEEE Transactions, Electron Devices, volume ED–11, pages 324–345, July 1964. Briefly, a MOST comprises a channel of a first conductivity type monocrystalline semiconductor material, a pair of monocrystalline semiconductor regions having a conductivity type opposite to the channel and spaced apart along the channel to form a source contact and a drain contact, and a metal gate placed over the channel and separated therefrom by a layer of insulating material such as silicon dioxide. The application of a certain voltage to the gate causes a region of the channel adjacent the gate to invert, that is, to exhibit a conductivity type opposite to its original conductivity type. In this manner the source and the drain are connected by a small part of the channel (the inverted region) having the same conductivity type as the source and the drain. This provides a conductive path between the source and the drain and forms the basis for the device's switching and amplifying action. The above described mode of operation is referred to as the enhancement mode.

The FET, which is described in detail in United States Patent Number 3,152,294, issued Oct. 6, 1964, is similar in construction to the MOST with the exception that the metal-oxide gate is replaced by a gate (and in some instances two gates) comprising a monocrystalline semiconductor region having a conductivity type opposite to the channel and forming a PN junction with the channel. The PN junction formed by the gate is reverse biased so that a depletion region is formed that extends into the channel. The depletion region is controlled by the gate voltage which in turn controls the channel conductivity, and the flow of current between the source and the drain. The above described mode of operation is referred to as the depletion mode.

This invention relates to a device which employs a metal-oxide gate, a depletion region, and an inversion region, thus, utilizing in part the physical phenomena of both the MOST and the FET but utilizing them in an unusual manner. The invented device may be operated in an enhancement or a depletion mode. When operated in the depletion mode it provides a semiconductor device having a tunable high pass filter response with positive insertion gain in the pass band.

The device employs a built-in channel having the same conductivity type as the source and the drain with a metal-oxide gate disposed over the channel. Without a bias applied to the gate the device is completely "on." When a gate voltage of a particular polarity is applied to the gate a depletion-type process occurs with a depletion region building up beneath the gate as the gate voltage is increased. An inversion region is also formed beneath the metal-oxide gate by application of a certain gate voltage. At a certain given value of gate voltage, VGC, the depletion region reaches a maximum depth and further increase of the biasing gate voltage will not increase the depth of the depletion region. With the gate set at the voltage greater than VGC, the application to the gate of signals below a certain frequency will not alter the depletion region but signals of a higher frequency will alter the depletion region. The inability of the low-frequency signals to alter the depletion region results in the source-drain current $I_{ds}$ remaining substantially constant during the application of such signals to the gate. The modulation of the depletion region by the high-frequency signals results in a related change in the source-drain current $I_{ds}$. Thus, the low-frequencies are attenuated or filtered from the output while the high frequency signals are passed thereto with a positive insertion gain. The value of the low-frequency signals that are filtered by the device may be adjusted by adjusting the drain bias or the operating temperature of the device, or by illuminating the device. The physical aspects of the invented device will be considered in detail in the description which follows.

From the above explanation, it can be seen that a semiconductor device has been invented where the inherent characteristics of the device provide a high pass filter response. This device is tunable by adjusting the drain voltage and provides a positive insertion gain in its pass band. It will also be apparent that the invented device may function as a light sensitive amplifier.

Briefly, the structure of the invention comprises a monocrystalline semiconductor bulk region having a first conductivity type, a monocrystalline semiconductor source and drain regions located adjacent said bulk region having a conductivity type opposite said bulk region, a monocrystalline semiconductor channel region located adjacent said bulk region having a conductivity type opposite said bulk region and coupling the source region to the drain region, and a gate overlying the channel and separated therefrom by a layer of insulator material. The channel region has a depth such that the depletion region created therein will not cut off the channel under normal operating circumstances.

The present invention is described below with reference to the accompanying drawings wherein.

Figure 1:
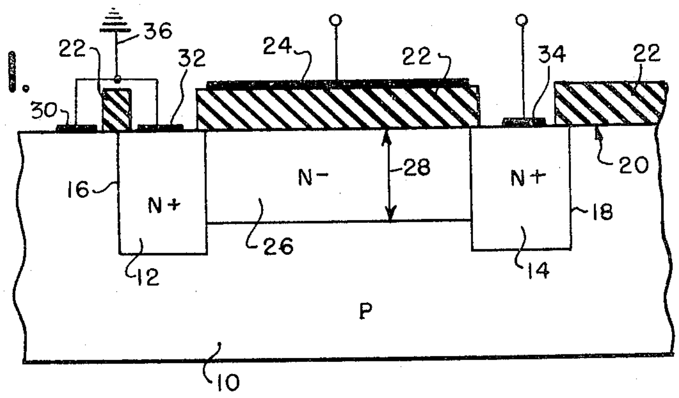
FIGURE 1 is a sectional view of the invented semiconductor device.

Referring to FIGURE 1, the invented device comprises a monocrystalline semiconductor bulk region 10 having a first conductivity type, such as a P-type conductivity. A monocrystalline semiconductor source region 12 and drain region 14 are formed within the bulk region form PN junctions 16 and 18 which extend to the surface 20 of bulk region 10. A layer of insulator and protective material 22 extends over part of the surface 20 and serves to protect the junctions 16 and 18 from contamination and also functions as an insulator to separate a metal gate 24 from a channel region 26. The channel region 26 is a monocrystalline semiconductor region located within bulk region 10 having the same conductivity type as source region 16 and drain region 18 but having a conductivity type opposite to bulk region 10. As compared to source region 12 and drain region 14 channel region 26 is lightly doped. The channel region 26 connects source region 12 to drain region 14 and has a depth 28 of a magnitude that regardless of the bias applied to gate 24, the channel region 26 will remain open, that is, it will not pinch off. Metal contacts 30, 32 and 34 are attached to bulk region 10, source region 12, and drain region 14, respectively. The geometry of the device may be circular.

Figure 3:
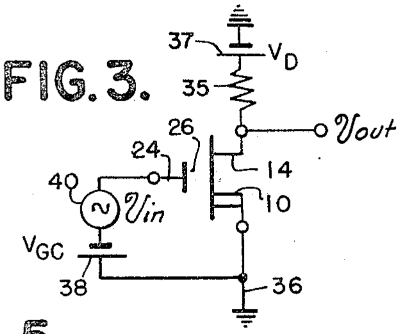
FIGURE 3 is a schematic circuit diagram employing the device.

Referring to FIGURES 1 and 3 in a typical circuit arrangement, the bulk region 10 and source region 12 are connected to ground via conductor 36. These regions may be connected to different potentials. The drain region 14 is connected to a means, such as a D.C. source 37, for applying a given bias $V_d$ to the drain. The D.C. source 37 is connected to the drain region 14 via the load resistor 35. A bias voltage greater than $V_{GC}$ is applied to gate 24 by a D.C. voltage source 38 along with an input signal $V_{in}$ supplied by the input signal means 40. In the embodiment shown in FIGURE 1, the negative terminal of source 38 is connected to the N-type channel, whereby the majority carriers are repelled from the region of the channel 26 adjacent the surface 20 and a depletion region is created. The bias signal supplied by source 38 to the gate has a value such that any further increase of the bias signal will not substantially alter the depletion region created in the channel. The approximate magnitude of the negative gate voltage at which this occurs is given by:

$$V_{GC}=\frac{qNd}{\epsilon_s}\left[\frac{X_{d\,max.}^2}{2}+\frac{\epsilon_s}{\epsilon_{0x}}(t_{ox})(X_{d\,max.})\right]$$

where $q$=electronic charge;
$\epsilon_s$=semiconductor dielectric constant;
$\epsilon_{0x}$=insulator material dielectric constant;
$t_{0x}$=thickness of gate insulator material;
$N_d$=net donor density in the N channel region assumed to be uniform; and
$X_{d\,max}$=maximum depth of the depletion region, wherein $X_{d\,max}$ is given by $$X_{d\,max.}=\left[\frac{4kT\epsilon_s}{q^2N_d}\ln\,(N_d/n_i)\right]^{1/2}$$

where $n_i$=intrinsic carrier density

The physical aspects of the device will be further considered later in the specification with regard to the operation of the device.

One specific example of a device built in accordance with the above structural features employs silicon with the channel region epitaxially grown thereon and the source and contact regions subsequently formed by well-known photoengraving and diffusion techniques. The insulator material may be formed by thermal, anodic or pyrolitic growth or a combination of these methods whereby a layer of silicon dioxide is formed on surface 20. The device is completed by employing well-known deposition and photoengraving techniques to form the contacts to the source, drain, and the gate. An example of the physical properties of such a device are as follows: channel length, that is, the distance between the source and drain regions$=6\times10^{-3}$ centimeters; channel width=0.12 centimeters; channel depth (28)$=1\times10^{-4}$ centimeters; gate oxide depth$=2\times10^{-5}$ centimeters; channel doping$=10^6$ centimeters$^{-3}$; bulk doping$=2\times10^6$ centimeters$^{-3}$.

Figure 2:
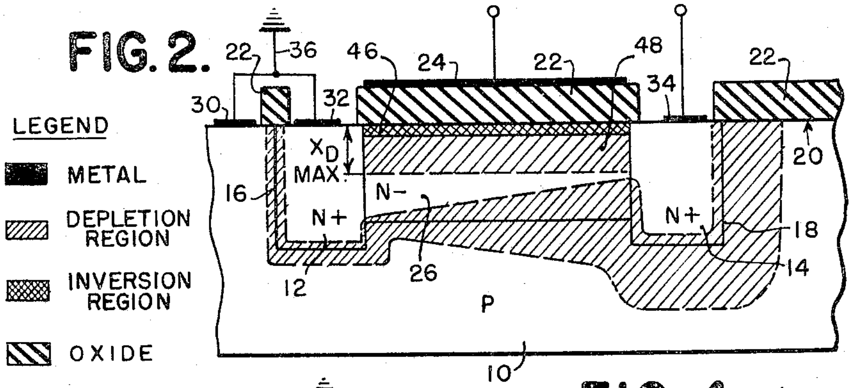
FIGURE 2 is a sectional view of the device with the depletion region and inversion region shown as they would appear with the voltage greater than $V_{GC}$ applied to the gate and the voltage $+V_d$ applied to the drain.

With the specific aspects of the device in mind, its operation will now be considered. In operation, without any bias signal applied to the gate 24, there is a finite conductance between the source and drain regions whose magnitude is determined by the channel geometry and doping. Application of the negative bias voltage to gate 24 results in a depletion of electrons in channel region 26 extending from surface 20 and in the vicinity thereof and hence in decrease of the channel conductance. This mode of operation is commonly referred to as depletion type of operation since the majority carriers are depleted by the application of the bias signal. The depletion region 48 formed is clearly shown in FIGURE 2.

When a large enough bias signal, that is, a large negative voltage, is applied to gate 24, depletion region 48 extending from the surface reaches a maximum depth and saturates at a value $X_{d\,max}$, which maximum primarily depends on the doping in the channel. Further increase of the bias voltage, once the critical gate voltage $V_{GC}$ is applied, will not substantially effect the depth of depletion region 48, that is, the channel conductance due to the contribution of electrons does not change further. The depth 28 of channel region 26 is made large enough so that the channel is not pinched or shut off when the critical voltage $V_{GC}$ is applied to gate 24. Further, negative charge deposited on gate 24 is counter-balanced by the buildup of holes near the surface 20, that is, the inversion of the channel region 26 adjacent surface 20 and the formation of an inversion region 46. This inversion region 46 is clearly shown in FIGURE 2. The holes in the inversion region 46 do not contribute to the conductance between source region 12 and drain region 14. This is due to the N+ doping of the source and drain regions which along with their connection to ground and the positive terminal of the drain source $V_d$, respectively, block hole conduction. Thus, the source to drain current reaches a minimum value $I_{ds\,min}$, and cannot be further modulated by increasing the gate bias voltage.

With the gate bias voltage greater than $V_{GC}$ applied to the gate and the drain current at the minimum saturation value $I_{ds\,min}$, the application of a sufficiently low frequency input signal to gate 24 will result in substantially no change in depletion region 48. When the input signal frequency is sufficiently low, the hole concentration, that is, minority carriers in the N-type channel, inversion region 46 can follow the input signal variations and equilibrium is achieved with no change of electron distribution in the channel. Thus, there is zero transconductance between the drain and the gate terminals and there is no gain in the system. This, in essence, amounts to an attenuation or filtering of the low frequency input signals applied to the gate. The process of equilibrium by inversion region 46 is determined by the minority carrier generation in and around the depletion region. For a given rate of generation of minority carriers, there will be a frequency above which the hole concentration in the inversion region 42 cannot reach equilibrium or follow the input signal applied to the gate. In the case of input signals having such frequencies, depletion region 48 will be modulated and the electron contribution to the channel conductance is affected by the input signal to the gate. This gives rise to a finite transconductance and, a gain in the system. Thus, the device behaves like a high-pass filter with a positive insertion gain.

The cutoff frequency of the invented semiconductor filter is directly proportional to the minority carrier generation rate in the channel region. This minority carrier generation is detemined by the generation of carriers by thermal means, secondary ionization and illumination. In a device that has a fixed drain voltage and which is not exposed to illumination, the primary source controlling minority carrier generation rate is the thermal process. The minority carrier generation rate provided by thermal processes is substantially determined by the particular doping of the channel region and the temperature of operation. By changing the drain bias, the minority carrier generation rate attributable to secondary ionization is altered. In this manner, the cutoff frequency may be readily changed by adjusting the drain bias which in turn alters the equilibrium point.

With regard to minority carrier generation by illumination, this means of generation forms the basis of employing the invented device as a light sensitive amplifier. The voltage gain versus frequency curves and the cutoff frequency of the invented device will change with the application of different light intensities to the channel region. The cutoff frequency will increase with increasing light intensity. Any of the many well known light source means that are capable of directing light to impinge on the device, such as a light microscope, may be employed in such an arrangment. Thus, the invented device may be employed as light sensitive amplifier.

Figure 4:
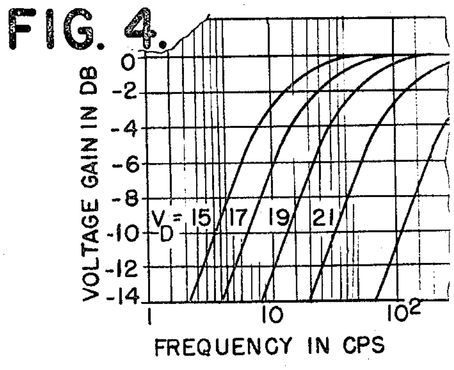
FIGURE 4 is a graph of the voltage gain versus frequency of the device.
Figure 5:
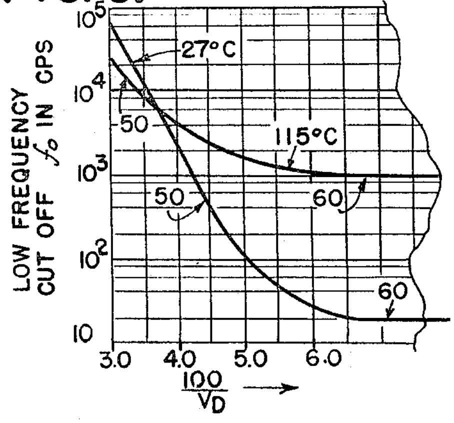
FIGURE 5 is a graph of the low-frequency cutoff versus 100 divided by the drain voltage.

A more technical understanding of the device can be achieved by considering the performance characteristics as shown in the graphs of FIGURES 4 and 5. FIGURE 4 shows the response characteristic of the invented device. The voltage gain falls off 6 db per octave with a fairly uniform slope below the knee of the curves. It can also be seen from FIGURE 4 that the —3 db gain point occurs at a higher frequency when the drain voltage $V_d$ is increased. This is consistent with the above explanation that an increase in drain voltage causes increased secondary ionization and increases the rate of minority carrier generation, whereby the cutoff frequency is increased.

FIGURE 5 shows the low-frequency cutoff $f_o$ (—3 db frequency) of an amplifier, such as the one shown in FIGURE 3, as a function of $100/V_d$ for various temperatures. For any given temperature, the $f_o$ versus $100/V_d$ curve has two distinct regions 50 and 60. One region 50 corresponds to the linear variation of the log of cutoff frequency $f_o$ at lower values of $100/V_d$ and the other region 60 is a plateau or constant cutoff frequency $f_o$ at higher values of $100/V_d$. The plateau region of the curves indicate that at lower values of drain voltage $V_d$ the cutoff frequency $f_o$ is not substantially affected by the drain voltage. At higher drain voltages, the secondary ionization process becomes an important factor in the minority carrier generation rate and the cutoff frequency is readily adjusted by changes in the drain voltage. One other striking feature of this set of curves is their crossover indicating a sign change of the temperature coefficient of cutoff frequency $f_o$ with the variation of the value $100/V_d$. The temperature coefficient is positive in the plateau region 60 and negative in the linear variation region 50.

In summary, this invention provides a semiconductor device that may function as a filter and provide a voltage gain or positive insertion gain over its pass band. The filter response of the device may be readily adjusted by altering the drain voltage. The semiconductor filter employs no passive elements and is completely fabricated according to well known planar semiconductor processing techniques. The device may be readily operated as a light sensitive amplifier. And finally, the device may be operated in the depletion mode or the enhancement mode. As is apparent to one of ordinary skill in the art, the enhancement mode of operation is readily attained by placing a bias on the gate that attracts majority carriers, such as a positive voltage in the embodiment of FIGURES 1–3.

No effort has been made to exhaust the possible embodiments of the invention. It will be understood that the embodiment described is merely illustrative of the preferred form of the invention and various modifications may be made therein without departing from the scope and spirit of this invention.

What is claimed is:

1. A semiconductor device comprising:

a monocrystalline semiconductor bulk region having a first conductivity type;

a monocrystalline semiconductor source region located adjacent said bulk region having a conductivity type opposite said bulk region;

a monocrystalline semiconductor drain region located adjacent said bulk region having a conductivity type opposite said bulk region;

a monocrystalline semiconductor channel region located adajcent said bulk region having a conductivity type opposite said bulk region and coupling said source region to said drain region, said channel having a depth such that any depletion region created therein will not cut off the channel under normal operating conditions; and, a gate means overlying said channel and insulatedly separated therefrom;

bias means to said gate to enable only signals greater than a given frequency to alter a signal passing from the source region to the drain region.

2. A semiconductor device comprising:

a monocrystalline semiconductor bulk region having a first conductivity type;

a monocrystalline semiconductor source region located adjacent said bulk region having a conductivity type opposite said bulk region;

a monocrystalline semiconductor drain region located adjacent said bulk region and having a conductivity type opposite said bulk region;

a monocrystalline semiconductor channel region located adjacent said bulk region having a conductivity type opposite said bulk region and coupling said source region to said drain region, said channel region having a depth such that any depletion region created therein will not cut off the channel under normal operating conditions;

a gate means overlying said channel and separated therefrom by a layer of insulation material; and, a bias means for applying a given bias voltage to said gate having a polarity which tends to repel the majority carriers in said channel and to form a depletion region and which has a magnitude such that further increase of said bias voltage does not substantially alter the depletion region of said channel, to enable only signals supplied to said gate greater than a given frequency alter the signal passing from the source region to the drain region.

3. A semiconductor device having a high-pass filter-type response with insertion gain in the pass-band comprising:

a monocrystalline semiconductor bulk region having a first conductivity type;

a monocrystalline semiconductor source region located adjacent said bulk region having a conductivity type opposite said bulk region; a monocrystalline semiconductor drain region located adjacent said bulk region and having a conductivity type opposite said bulk region;

a monocrystalline semiconductor channel region located adjacent said bulk region having a conductivity type opposite said bulk region and coupling said source region to said drain region said channel region having a depth such that any depletion region created therein will not cut off the channel under normal operating conditions;

a gate means overlying said channel and separated therefrom by a layer of insulation material;

a first bias means for applying a bias signal to said gate having a polarity which tends to repel the majority carriers in said channel region and to form a depletion region and having a value such that further increase of said bias signal does not alter the depletion region of said channel region; and, a second bias means for adjustably applying a bias signal to said drain region, said first and second bias means enabling only signals supplied to said gate means greater than a given frequency to alter the signal passing from the source region to the drain region, said given frequency being variable by varying the bias signal of said second bias means.

4. A light sensitive device comprising:

a monocrystalline semiconductor bulk region having a first conductivity type;

a monocrystalline semiconductor source region located adjacent said bulk region having a conductivity type opposite said bulk region;

a monocrystalline semiconductor drain region located adjacent said bulk region having a conductivity type opposite said bulk region;

a monocrystalline semiconductor channel region located adjacent said bulk region having a conductivity type opposite said bulk region and coupling said source region to said drain region said channel region having a depth such that any depletion region created therein will not cut off the channel under normal operating conditions;

a gate means overlying said channel and insulatedly separated therefrom;

bias means for applying a bias signal to said gate having a polarity which tends to repel the majority carriers in said channel region and to form a depletion region therein, and having a value such that further increase of said bias signal does not substantially alter the depletion region;

means for impinging light in the vicinity of said channel region, the amount of said impinging light determining the frequency range of the signal supplied to said gate means which affects the signals passing from the source region to the drain region.

References Cited by the Examiner

UNITED STATES PATENTS

| | | | |
|---|---|---|---|
| 2,985,805 | 5/1961 | Nelson | 317—235 |
| 3,177,100 | 4/1965 | Mayer et al. | 148—175 |

OTHER REFERENCES

F. M. Wanlass, Electronics, pp. 30–33, Nov. 1, 1963.

JOHN W. HUCKERT, *Primary Examiner.*

M. EDLOW, *Assistant Examiner.*